(12) United States Patent
Gustavsen et al.

(10) Patent No.: US 6,201,706 B1
(45) Date of Patent: Mar. 13, 2001

(54) POWER SUPPLY DEVICE WITH EXTERNALLY DISCONNECTABLE "Y" CAPACITORS

(75) Inventors: Gary G. Gustavsen, Lakegrove; James Nicollet, Hicksville, both of NY (US)

(73) Assignee: Lambda Electronics, Inc., Melville, NY (US)

( * ) Notice: Subject to any disclaimer, the term of this patent is extended or adjusted under 35 U.S.C. 154(b) by 0 days.

(21) Appl. No.: 09/204,932

(22) Filed: Dec. 3, 1998

(51) Int. Cl.⁷ ....................................... H05K 5/00
(52) U.S. Cl. .......................... 361/753; 361/752; 361/799; 361/800; 361/816; 361/818; 174/51; 211/41.17; 220/4.02
(58) Field of Search .................... 361/685, 752, 361/753, 758, 799, 800, 816, 818; 174/35 R, 51; 211/41.17, 206; 220/4.02; 248/560, 562

(56) References Cited

U.S. PATENT DOCUMENTS

| | | | |
|---|---|---|---|
| 3,816,911 | * | 6/1974 | Knappenberger ................ 29/626 |
| 4,580,112 | | 4/1986 | Winslow ......................... 333/12 |
| 4,661,888 | * | 4/1987 | Jewell et al. ................... 361/818 |
| 4,686,614 | | 8/1987 | Costello ......................... 363/17 |
| 4,717,989 | * | 1/1988 | De Barros et al. ............. 361/818 |
| 5,107,404 | * | 4/1992 | Tam ............................... 361/818 |
| 5,252,782 | * | 10/1993 | Cantrell et al. ................ 174/35 R |
| 5,329,422 | * | 7/1994 | Sasaki ............................ 361/686 |
| 5,513,088 | | 4/1996 | Williamson .................... 363/20 |
| 5,815,771 | | 9/1998 | Dhande et al. ................. 399/90 |

OTHER PUBLICATIONS

International Search Report for corresponding International Application No. PCT/US99/28523, dated Mar. 28, 2000.
1998 Lambda catalog pp. 58–61 (LZS/SE Series power supply specifications).

* cited by examiner

Primary Examiner—Jeffrey Gaffin
Assistant Examiner—Tuan Dinh
(74) Attorney, Agent, or Firm—Morgan & Finnegan LLP

(57) ABSTRACT

The present invention relates to a power supply device having an electromagnetic interference ("EMI") suppression circuit connected to the input terminals. The EMI suppression circuit is mounted within the power supply device to ensure a low-impedance path to ground. Furthermore, the EMI suppression circuit can be quickly, easily and safely disconnected from ground without opening the power supply device.

17 Claims, 4 Drawing Sheets

US 6,201,706 B1

POWER SUPPLY DEVICE WITH EXTERNALLY DISCONNECTABLE "Y" CAPACITORS

FIELD OF THE INVENTION

The present invention relates generally to an electric power supply device having an internal electromagnetic interference filter.

BACKGROUND OF THE INVENTION

Electromagnetic interference ("EMI") is an electrical noise current which is usually present in the radio-wave frequency range. This current originates from within a system of electrical devices rather than an outside source such as a radio signal transmitter. Electric power supplies are known to be significant generators of EMI. In connection with electric power supplies, EMI is undesirable because, for example, it can disturb the operation or degrade the performance of other equipment connected to the same source of AC power.

EMI filters frequently incorporate "Y" capacitors ("Y-caps") as part of their noise suppression circuitry. These circuit elements typically connect near a power supply's input terminals and terminate at an electrical ground. By diverting common-mode current to an electrical ground, undesirable electrical noise current can be suppressed thereby preventing EMI from leaving the power supply via its input terminals and disturbing other equipment electrically connected to the same AC source.

In most known power supplies, EMI filtering incorporates a Y-cap circuit which is permanently connected to the power supply ground within the power supply's housing. This configuration typically allows the capacitor to be located very close to the electrical ground, thereby optimizing EMI suppression. However, the internally mounted Y-caps of conventional power supply devices are very difficult to disconnect from the power supply ground.

For a variety of reasons, some power supply end-users do not want a Y-cap circuit permanently connected to the power supply ground. One drawback in using a Y-cap circuit for EMI suppression is the attendant "leakage current" which flows into the electrical ground. For instance, whenever an alternating current (AC) voltage is applied across a Y-cap circuit, some amount of current will "leak" through it.

Some power supply users prefer a supply with minimal or no leakage current, even at the expense of reduced EMI suppression. For example, electric power supplies are frequently used to drive medical equipment. In this application of a power supply, leakage current must be reduced in order to ensure the safety of medical patients and equipment operators.

It is therefore an object of the present invention to provide a power supply device which has externally detachable "Y" capacitors located within the power supply.

It is a further object of the present invention to provide a power supply with an EMI suppression circuit which has a low-impedance path to an electrical ground.

SUMMARY OF THE INVENTION

The disadvantages of conventional power supplies have been overcome by the power supply device of the present invention. This power supply features an externally detachable, internally mounted Y-cap circuit having a low-impedance path for optimal EMI suppression.

One embodiment of the present invention features a power supply device including a chassis, a printed circuit board attached to the chassis, and a housing sheltering the printed circuit board. This embodiment further includes input terminals for connecting the power supply to its power source, wherein the input terminals are electrically connected to the printed circuit board, and an electromagnetic interference suppression circuit is connected to the input terminals. The electromagnetic interference suppression circuit may include capacitors electrically connected to the printed circuit board and to the input terminals. This circuit may also include a grounding mechanism of electrically conducting material detachably and electrically connected to both an electrical ground and the printed circuit board for electrically grounding the capacitors, wherein the grounding mechanism is accessible from outside the power supply device.

The power supply device of the present invention includes several advantages over conventional power supply devices. For example, the technique employed is advantageous because EMI can be suppressed without the need for an extra power supply terminal. A second advantageous feature of the power supply device of the present invention is the short impedance path between the capacitors in the Y-cap circuit and their corresponding connection to ground.

A further advantage of the power supply of the present invention is the ease with which an operator can safely and quickly detach the Y-cap circuit—which is located within the power supply's housing—without opening the housing. Typically, manufacturers construct power supplies such that it is not convenient for the customer or operator to open the housing. The power supply of the present invention allows the customer or operator to disconnect the internally mounted Y-cap circuit by simply removing a fastener accessible from outside the power supply. Thus, the Y-cap circuit can be detached easily, safely and without damaging the power supply housing, chassis or internal components.

A power supply device featuring externally detachable Y capacitors is particularly advantageous in two situations. In some applications, a power supply is connected to a source that has its own EMI filter. Here, the internal Y-cap circuit would be detached so that the resulting combination would not pay the leakage-current penalty twice. Disconnecting the Y-cap circuit located within the power supply causes a significant reduction in leakage current. In other applications, the device powered by the supply cannot perform optimally, or sometimes even adequately, if leakage current exists. In this second scenario, the power supply operator avoids leakage current by detaching the internal Y-cap circuit for some uses while retaining the ability to reconnect the Y-cap circuit when the power supply is put to alternative uses.

BRIEF DESCRIPTION OF THE DRAWINGS

The foregoing features and other aspects of the invention are explained in the following description taken in connection with the accompanying drawings, wherein.

DETAILED DESCRIPTION OF PREFERRED EMBODIMENTS

Various embodiments of the power supply device of the present invention will now be described with reference to the drawings.

Figure 1:
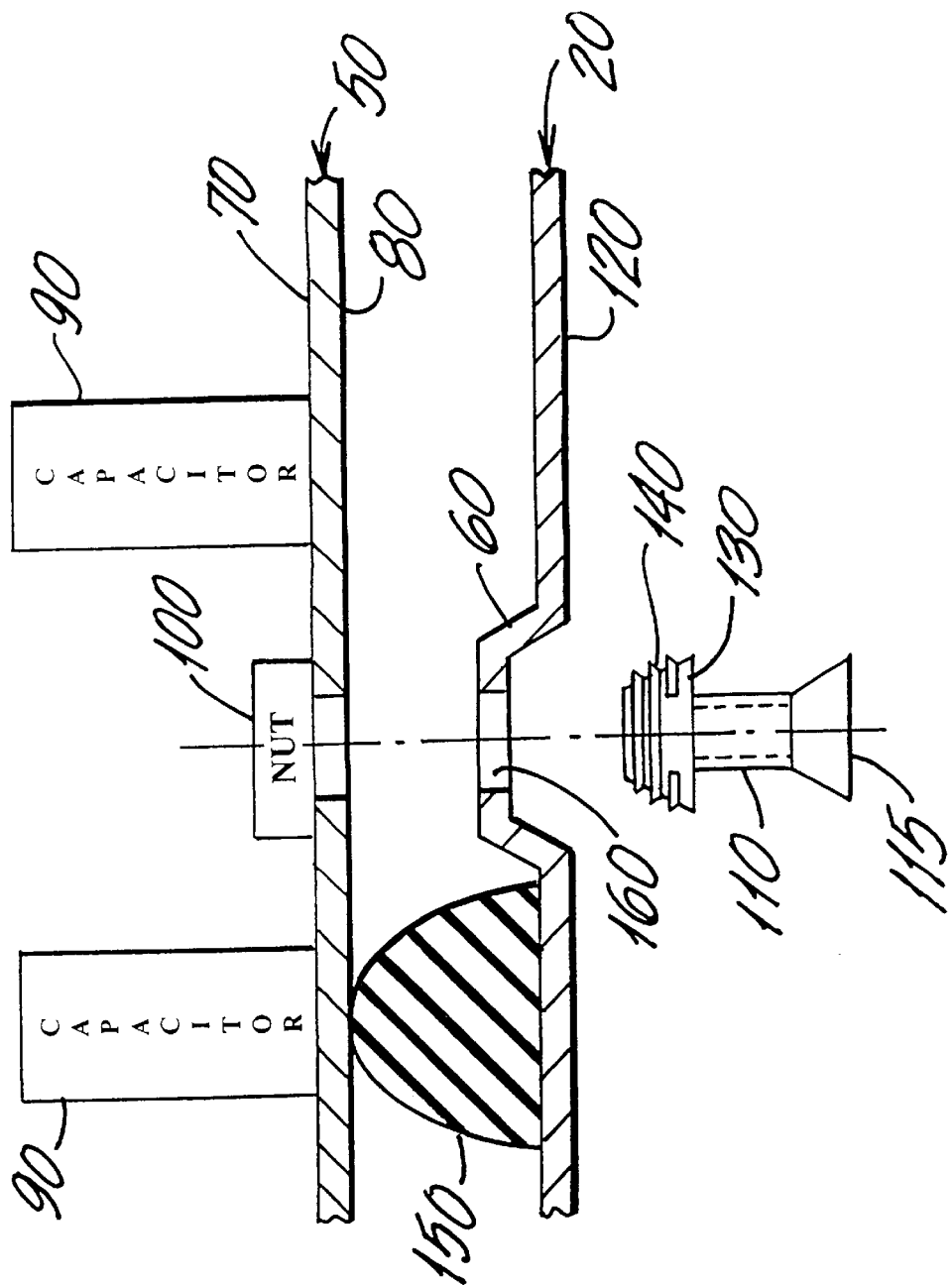
FIG. 1 is a simplified cross-sectional view of the power supply device according to one embodiment of the present invention.
Figure 2:
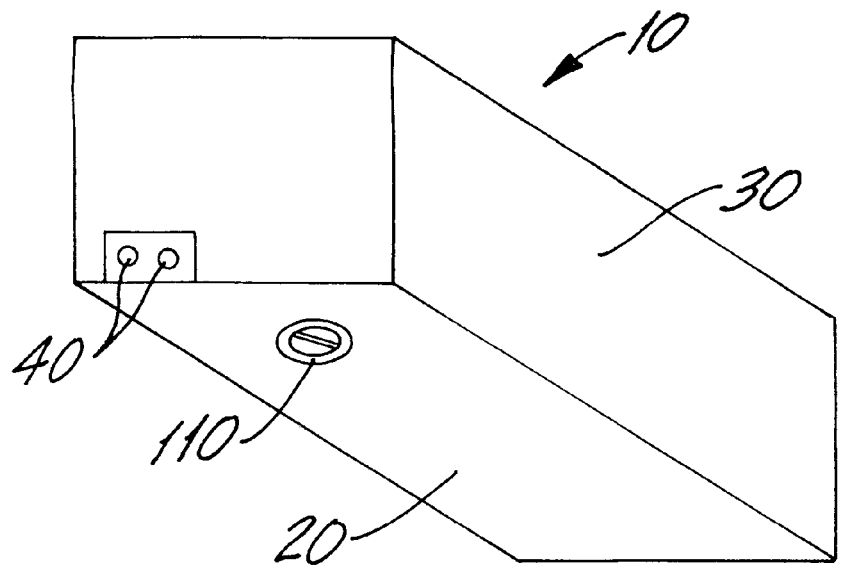
FIG. 2 is a perspective view of the power supply device according to the embodiment of the present invention shown in FIG. 1.

With reference to FIGS. 1 and 2, the primary components of the power supply device 10 are displayed in their respective positions relative to one another. The power supply device 10 of the embodiment depicted in FIGS. 1 and 2 includes a chassis 20, a housing 30, input terminals 40 and a planar printed circuit board ("PCB") 50, each of which will now be described in greater detail below.

The chassis 20 functions as a base upon which various components of the power supply device are attached or affixed. The chassis 20 can be manufactured from a number of conductive materials such as a metal material. In addition, the chassis can be comprised of a single member, or multiple members. In the embodiment shown in FIGS. 1 and 2, the chassis 20 contains a dimple 60 and at least one hole 160 in the dimple 60.

The housing 30 is permanently or semi-permanently attached to the chassis 20 in order to shelter the PCB 50 from the surrounding environment. This housing 30 can be manufactured from a number of materials such as metals, plastics and composite fibers, among others. It can be made of a single member, or multiple members. Furthermore, it is to be understood that the size and shape of the housing can be determined by considerations such as aesthetic appeal, arrangement and size of the other components of the power supply, and the particular application of the power supply device. In the embodiments shown in FIGS. 3–5, the housing 30 contains a dimple 65 and at least one hole 165 in the dimple 65.

The PCB 50 is typically comprised of an epoxy/fiberglass laminate substrate clad with an etched sheet of copper to delineate conductive paths. The PCB 50 has a top surface 70 and a bottom surface 80. Typically, electronic components used to generate electrical power are interconnected on the top surface 70 of the PCB 50. Other electronic components may also be interconnected on the PCB 50, including components used to suppress EMI.

Figure 4:
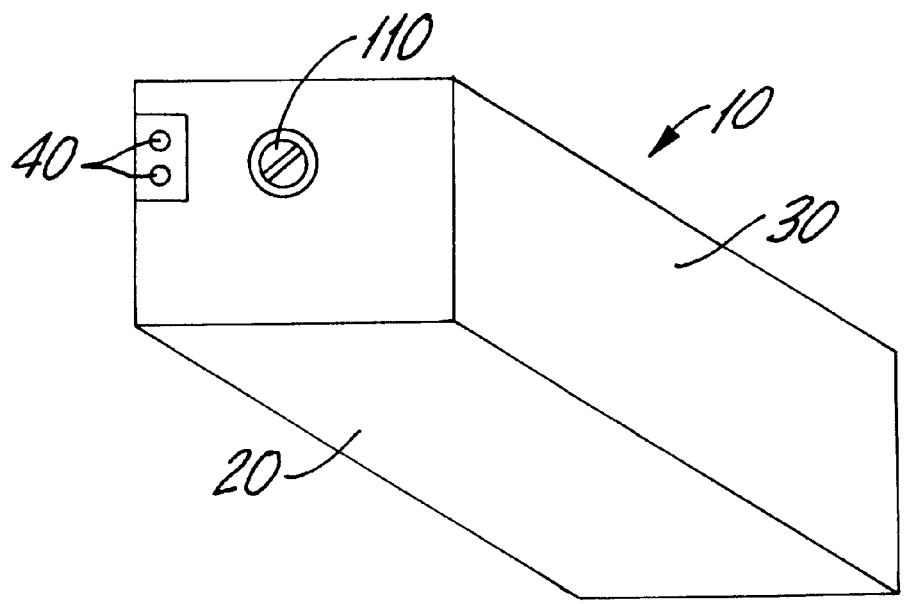
FIG. 4 is a perspective view of the power supply device according to the embodiment of the present invention shown in FIG. 3.
Figure 3:
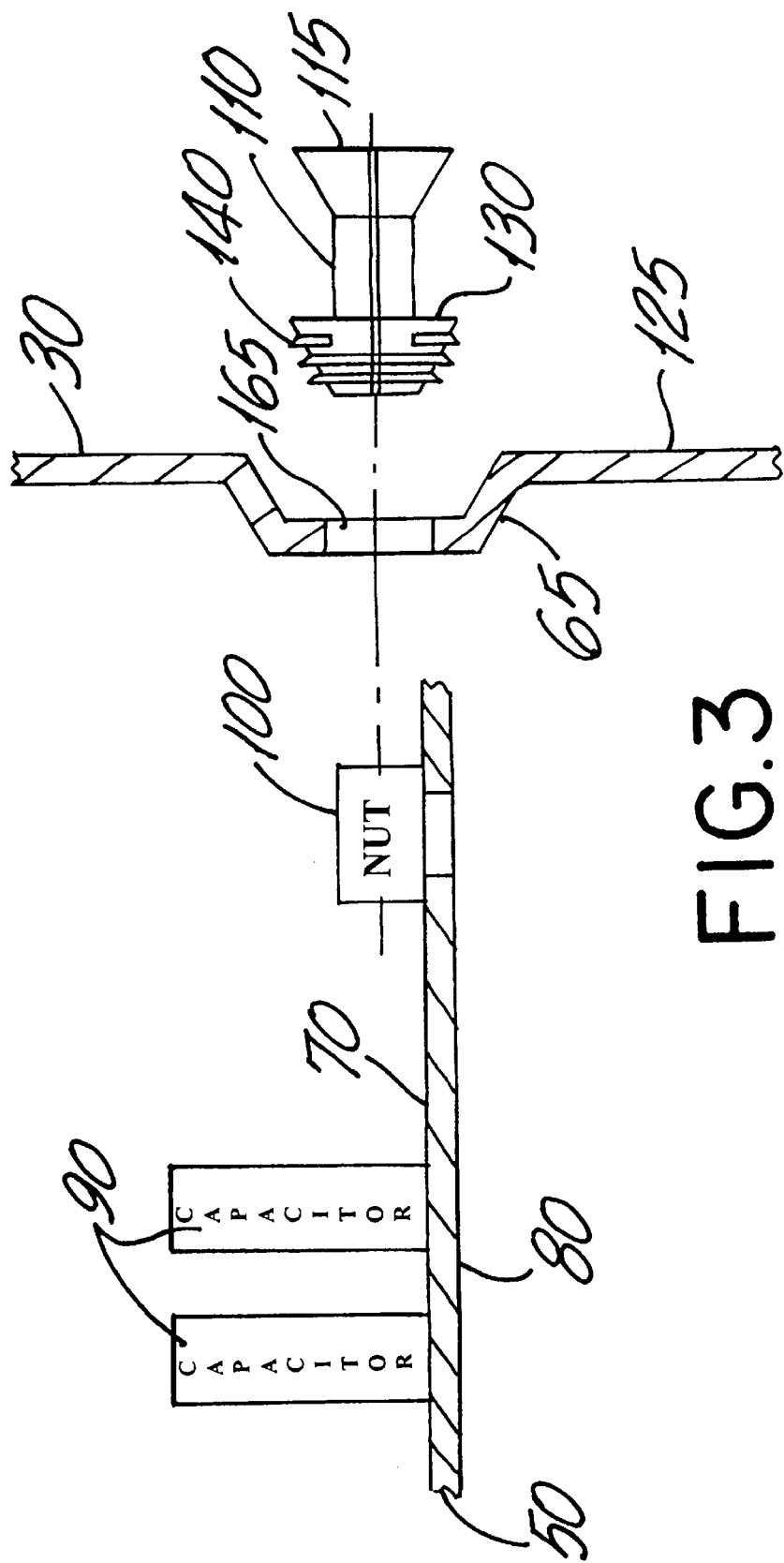
FIG. 3 is a simplified cross-sectional view of the power supply device according to a second embodiment of the present invention.
Figure 5:
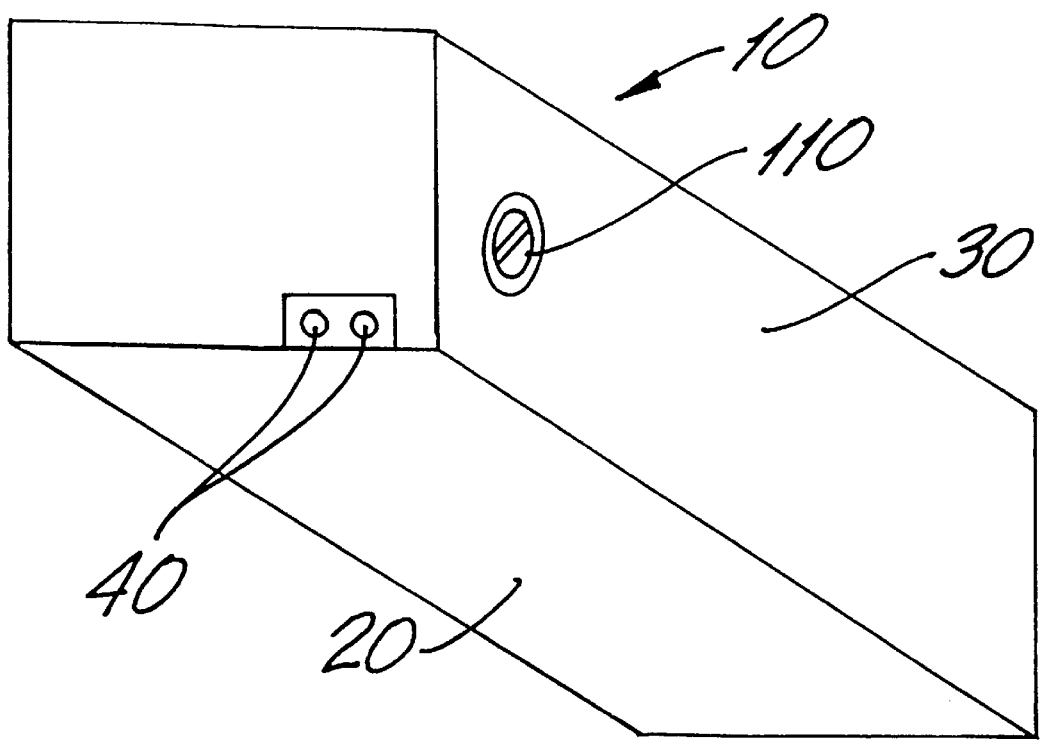
FIG. 5 is a perspective view of the power supply device according to a third embodiment of the present invention.

In order to suppress EMI according to one embodiment of the present invention, capacitors 90 are mounted on and electrically connected to the PCB 50. An EMI suppression circuit is created by electrically interconnecting the capacitors 90 between the input terminals 40 and an electrical ground. In the embodiment depicted in FIGS. 1 and 2, the chassis 20 serves as the electrical ground. In alternative embodiments as shown in FIGS. 3–5, the housing is used to ground the EMI suppression circuit. However, it is to be understood that the housing 30 cannot be used as an electrical ground unless it is made of electrically conductive material.

In order to facilitate electrical grounding of the PCB 50, a nut 100 is physically and electrically connected to the PCB 50. This nut 100 can be manufactured from a number of conductive materials including, for example, metal material. A number 4-40 broaching nut is used in the embodiment shown in FIG. 1.

With reference to FIGS. 1 and 3, the capacitors 90 are electrically grounded to the chassis 20 as shown in FIG. 1 (or the housing 30 as shown in FIG. 3) by threading or otherwise inserting a fastener 110 through the hole 160 in the chassis 20 (or the hole 165 in the housing 30) and into engagement with the nut 100. This fastener 110 can be manufactured from a number of conductive materials including, for example, metal material. A number 4-40 flat-head screw is used in the embodiment shown in FIG. 1. In an alternative embodiment (not shown), a bolt is used. However, it is to be understood that other fasteners may be used, so that the type of fastener 110 used in the present invention need not be limited to threaded fasteners.

With reference to FIG.1, if no hole initially exists in the chassis 20, the hole 160 can be created when the fastener 110 is threaded or otherwise inserted through the chassis 20 for the purpose of electrically grounding the capacitors 90. Similarly, with reference to FIG. 3, if no hole initially exists in the housing 30, the hole 165 can be created when the fastener 110 is threaded or otherwise inserted through the housing 30.

It is to be understood that the fastener 110 can be inserted or removed with hardware equipment including without limitation: a screwdriver or wrench. However, in alternative embodiments of the present invention (not shown), the fastener 110 can also be inserted or removed without hardware equipment.

According to various embodiments of the present invention, the head 115 of the fastener 110 is approximately flush with the outer wall 120 of the chassis 20 (as shown in FIG. 2) or the outside wall 125 of the housing 30 (as shown in FIGS. 4 and 5) when the fastener 110 is fully engaged. However, in alternative embodiments (not shown), the head 115 of the fastener need not be flush with either the chassis 20 or the housing 30.

As shown in the embodiment depicted in FIG. 1, a lockwasher 130 is disposed between the head 115 of the fastener 110 and the chassis wall 120. This lockwasher 130 performs a number of functions. First, the teeth 140 of the lockwasher 130 scrape the paint away from the outer wall 120 of the chassis 20 (or, in another embodiment, the outside wall 125 of the housing 30) as the fastener 110 is being engaged with the nut 100. This ensures a solid electrical connection between the fastener 110 and the chassis 20 (or the housing 30), thereby providing an electrical ground for the Y-cap circuit. Second, the lockwasher 130 firmly secures the fastener 110 in place to prevent inadvertent disengagement of the fastener 110 from the nut 100. This lockwasher 130 can be manufactured from a number of conductive materials including, for example, metal material. A conical number 4 external tooth lockwasher is used in one embodiment.

In the embodiment shown in FIG. 1, a bumper 150 made of rubber, nylon or other electrically insulating material is located near the dimple 60 between the chassis 20 and the PCB 50. This bumper prevents damage to the PCB 50 if the fastener 110 is over-tightened.

Although specific embodiments of the present invention have been shown and described, it is to be understood that there are other embodiments which are equivalent to the described embodiments. Accordingly, it is to be understood that the invention is not to be limited by the specific illustrated embodiments, but only by the scope of the appended claims.

What is claimed is:

1. A power supply device comprising:

a printed circuit board;

a housing sheltering the printed circuit board;

an input terminal connecting the power supply to its source of power, wherein the input terminal is electrically connected to the printed circuit board; and an electromagnetic interference suppression circuit connected to the input terminal, the circuit comprising:

a capacitor electrically connected to the printed circuit board and to the input terminal; and a grounding mechanism, including electrically conducting material, detachably electrically connected to both an electrical ground and the printed circuit board for electrically grounding the capacitor, wherein the grounding mechanism is operably accessible from outside the power supply device for selectively connecting and disconnecting the capacitor to and from the electrical ground.

2. A power supply device according to claim 1, the grounding mechanism comprising:

a nut electrically connected to the printed circuit board; and a fastener inserted through a chassis, wherein the fastener is adapted for engaging with the nut thereby creating an electrical ground connection between the printed circuit board and the chassis.

3. A power supply device according to claim 2, further comprising a bumper disposed between the bottom side of the printed circuit board and the chassis for preventing damage to the printed circuit board.

4. A power supply device according to claim 2, the chassis having a dimple recessing into the power supply device.

5. A power supply device according to claim 1, the grounding mechanism comprising:

a nut electrically connected to the printed circuit board; and a fastener inserted through the housing, wherein the fastener is adapted for engaging with the nut thereby creating an electrical ground connection between the printed circuit board and the housing.

6. A power supply device according to claim 3, the housing having a dimple recessing into the power supply device.

7. A power supply device according to claim 1, comprising two input terminals.

8. A power supply device according to claim 1, wherein the input terminal comprises a barrier strip.

9. A power supply device according to claim 1, wherein the input terminal comprises a terminal block.

10. A power supply device comprising:

a printed circuit board;

means for sheltering the printed circuit board from the environment in which the power supply is located;

means for acquiring electrical power from a power source, the means for acquiring electrical power being electrically connected to the printed circuit board;

means for suppressing electromagnetic interference, the means for suppressing comprising:

a capacitor electrically connected to the printed circuit board and to the means for acquiring electrical power; and means for electrically grounding the capacitor, including an electrically conducting material, wherein the means for electrically grounding is operably accessible from outside the power supply device for selectively connecting and disconnecting the capacitor to and from electrical ground.

11. A power supply device according to claim 10, wherein the means for electrically grounding comprises an electrically conductive fastener inserted through the chassis.

12. A power supply device according to claim 10, wherein the means for electrically grounding comprises an electrically conductive fastener inserted through the housing.

13. A power supply device according to claim 10, further comprising a means for preventing damage to the printed circuit board during connection or disconnection with the means for electrically grounding the capacitor.

14. A method for operating a power supply device having an internally mounted electromagnetic interference suppression circuit that includes a capacitor, the method comprising:

providing a grounding mechanism capable of electrically connecting with the electromagnetic interference suppression circuit;

operating the grounding mechanism from outside the power supply device to selectively connect and disconnect the capacitor to and from electrical ground.

15. A method according to claim 14, further comprising securing hardware equipment to the grounding mechanism and using the hardware equipment to disconnect the grounding mechanism from its electrical connection to the electromagnetic interference suppression circuit.

16. A method according to claim 14, wherein the grounding mechanism is inserted through a chassis of the power supply device.

17. A method according to claim 14, wherein the grounding mechanism is inserted through a housing of the power supply device.

\* \* \* \* \*